US012622032B2

(12) United States Patent
Lee et al.

(10) Patent No.: US 12,622,032 B2
(45) Date of Patent: May 5, 2026

(54) MEMORY DEVICE HAVING A FLOATING GATE WITH A NANO-DOT REGION AND METHOD FOR FABRICATING THE SAME

(71) Applicants: Hyundai Motor Company, Seoul (KR); Kia Corporation, Seoul (KR); Research & Business Foundation Sungkyunkwan University, Suwon-si (KR)

(72) Inventors: Jong Seok Lee, Suwon-si (KR); Tae Ho Jeong, Yongin-si (KR); Ui Yeon Won, Ansan-si (KR); Woo Jong Yu, Suwon-si (KR)

(73) Assignees: Hyundai Motor Company, Seoul (KR); Kia Corporation, Seoul (KR); Research & Business Foundation Sungkyunkwan University, Suwon-si (KR)

( * ) Notice: Subject to any disclaimer, the term of this patent is extended or adjusted under 35 U.S.C. 154(b) by 806 days.

(21) Appl. No.: 17/872,819

(22) Filed: Jul. 25, 2022

(65) Prior Publication Data

US 2023/0112478 A1 Apr. 13, 2023

(30) Foreign Application Priority Data

Oct. 8, 2021 (KR) ........................ 10-2021-0134312

(51) Int. Cl.
*H10D 64/01* (2025.01)
*H10B 41/27* (2023.01)
(Continued)

(52) U.S. Cl.
CPC ........... *H10D 64/035* (2025.01); *H10B 41/27* (2023.02); *H10B 41/30* (2023.02); *H10D 62/118* (2025.01);
(Continued)

(58) Field of Classification Search
CPC ....... H10D 30/68–6894; H10D 30/701; H10D 64/20; H10D 64/23–256; H10B 41/00–70
See application file for complete search history.

(56) References Cited

U.S. PATENT DOCUMENTS

| | | | |
|---|---|---|---|
| 7,208,376 B2 | 4/2007 | Chen et al. | |
| 7,342,277 B2 * | 3/2008 | Radosavljevic | ..... H10K 10/464 |
| | | | 257/314 |
| 10,636,802 B2 * | 4/2020 | Yu | ........................ H10D 30/60 |

FOREIGN PATENT DOCUMENTS

| | | |
|---|---|---|
| CN | 1532937 A | 9/2004 |
| JP | H07130958 A | 5/1995 |

(Continued)

OTHER PUBLICATIONS

Choi, M. et al., "Controlled charge trapping by molybdenum disulphide and graphene in ultrathin heterostructured memory devices," Nature Communications, DOI: 10.1038/ncomms2652, Mar. 27, 2013, 7 pages.

*Primary Examiner* — Khaja Ahmad
*Assistant Examiner* — Candice Chan
(74) *Attorney, Agent, or Firm* — Slater Matsil, LLP

(57) ABSTRACT

An embodiment memory device includes a drain electrode disposed on a semiconductor substrate, a channel region in contact with the drain electrode, a source electrode in contact with the channel region, and a floating gate region in contact with the source electrode and the drain electrode, the floating gate region including a nano-dot region including at least one nano-dot gate, wherein the drain electrode is overlapped with the nano-dot region, and wherein the nano-dot region is overlapped with the channel region.

20 Claims, 11 Drawing Sheets

20

(51) Int. Cl.
  H10B 41/30          (2023.01)
  H10D 62/10          (2025.01)
  H10D 62/80          (2025.01)
  H10D 64/23          (2025.01)
(52) U.S. Cl.
  CPC ......... H10D 62/882 (2025.01); H10D 64/258
                                            (2025.01)

(56)                  References Cited

FOREIGN PATENT DOCUMENTS

| KR | 100736850 | B1 | 7/2007 |
| KR | 20080051010 | A | 6/2008 |
| KR | 20090011334 | A | 2/2009 |
| KR | 100898752 | B1 | 5/2009 |
| KR | 20110131509 | A | 12/2011 |
| KR | 20160139319 | A | 12/2016 |
| KR | 20170096508 | A | 8/2017 |
| KR | 101789405 | B1 | 10/2017 |
| KR | 102111526 | B1 | 6/2020 |

* cited by examiner

10

30

150

110

150

140

150

120a

110

MEMORY DEVICE HAVING A FLOATING GATE WITH A NANO-DOT REGION AND METHOD FOR FABRICATING THE SAME

CROSS-REFERENCE TO RELATED APPLICATIONS

This application claims the benefit of Korean Patent Application No. 10-2021-0134312, filed on Oct. 8, 2021, which application is hereby incorporated herein by reference.

TECHNICAL FIELD

The present disclosure relates to a memory device including a nano-structure and a method for fabricating the same.

BACKGROUND

A memory system is a component to store data in various electronic devices, and a non-volatile memory of various memories may store information even if power is cut off.

A flash memory of non-volatile memories includes a gate insulator and a gate electrode and an oxide and is thick and rigid. Accordingly, the flash memory requires higher power consumption, and the integration of the flash memory is difficult.

In addition, the flash memory may inject electrons or holes into a floating gate using a voltage applied to a gate electrode. As the operation of injecting the electrons or the holes into the floating gate is repeated, an insulating layer included in the floating gate may be deteriorated. As the insulating layer is deteriorated, a leakage current may be caused. As the leakage current is caused, the threshold voltage of the memory device is changed, such that the stored data may be distorted, and the performance of the memory device may be deteriorated.

Accordingly, there is required a structure for implementing a smaller memory device and for preventing a leakage current.

SUMMARY

Embodiments of the present disclosure can solve problems occurring in the prior art while advantages achieved by the prior art are maintained intact.

An embodiment of the present disclosure provides a memory device structure having the enhanced degree of integration by skipping a gate electrode.

In addition, embodiments of the present disclosure provide a memory device having improved endurance and reliability, as a floating gate of the memory device includes at least one nano-dot gate.

The technical problems to be solved by embodiments of the present disclosure are not limited to the aforementioned problems, and any other technical problems not mentioned herein will be clearly understood from the following description by those skilled in the art to which the present disclosure pertains.

According to an embodiment of the present disclosure, a memory device may include a drain electrode disposed on a semiconductor substrate, a channel region making contact with the drain electrode, a source electrode making contact with the channel region and a floating gate region making contact with the source electrode and the drain electrode. The floating gate region may include a nano-dot region including at least one nano-dot gate, the drain electrode may be overlapped with the nano-dot region, and the nano-dot region may be overlapped with the channel region.

In addition, according to an embodiment, the overlap region between the nano-dot region and the channel region may be overlapped with the drain electrode.

In addition, according to an embodiment, the drain electrode may include a first electrode making contact with the semiconductor substrate while extending in parallel to one surface of the semiconductor substrate, a second electrode making contact with the lateral side of the floating gate region while extending perpendicular to one surface of the semiconductor substrate, and a third electrode making contact with the one surface of the floating gate region while extending in parallel to the one surface of the semiconductor substrate.

In addition, according to an embodiment, the third electrode may be overlapped with the nano-dot region and the channel region.

In addition, according to an embodiment, the channel region may be interposed between the semiconductor substrate and the floating gate region.

In addition, according to an embodiment, the channel region may include a first region making contact with the drain electrode while extending in parallel to one surface of the drain electrode, a second region making contact with a lateral side of the floating gate region while extending perpendicularly to the one surface of the drain electrode, and a third region making contact with one surface of the floating gate region while extending in parallel to the one surface of the drain electrode.

In addition, according to an embodiment, the third region may be overlapped with the nano-dot region and the drain electrode.

In addition, according to an embodiment, the drain electrode may be interposed between the semiconductor substrate and the channel region.

In addition, according to an embodiment, the floating gate region may include an insulating layer region to surround the at least one nano-dot gate.

In addition, according to an embodiment, the nano-dot gate may be electrically isolated from another nano-dot gate adjacent to the insulating region.

In addition, according to an embodiment, the insulating layer region may include at least one selected from the group consisting of boron hexagonal nitride (h-BN), aluminum oxide ($Al_2O_3$), hafnium oxide ($HfO_2$), and silicon nitride.

In addition, according to an embodiment, charges may be tunneled into the at least one nano-dot gate from the drain electrode due to the voltage applied to the drain electrode.

In addition, according to an embodiment, an electron may be tunneled from the drain electrode to the at least one nano-dot gate due to the first voltage applied to the drain electrode, and a hole may be tunneled from the drain electrode to the at least one nano-dot gate due to a second voltage applied to the drain electrode.

In addition, according to an embodiment, the channel region may be controlled to be turned on and turned off by the voltage applied to the drain electrode.

In addition, according to an embodiment, the channel region may include a semiconductor material.

In addition, according to an embodiment, the semiconductor material may include at least one selected from the group consisting of zinc oxide (ZnO), molybdenum disulfide ($MoS_2$), tungsten diselenide ($WSe_2$), tungsten disulfide ($WS_2$), molybdenum diselenide ($MoSe_2$), silicon (Si), germanium (Ge), semiconductor carbon nano-tubes (CNT), and black phosphorus (BP).

In addition, according to an embodiment, the nano-dot gate may include at least one selected from the group consisting of a metal material and graphene.

Further, according to an embodiment, the distance from the drain electrode to the nano-dot gate may be 10 nm or less.

BRIEF DESCRIPTION OF THE DRAWINGS

The above and other objects, features and advantages of embodiments of the present disclosure will be more apparent from the following detailed description taken in conjunction with the accompanying drawings, in which.

DETAILED DESCRIPTION OF ILLUSTRATIVE EMBODIMENTS

Figure 1:
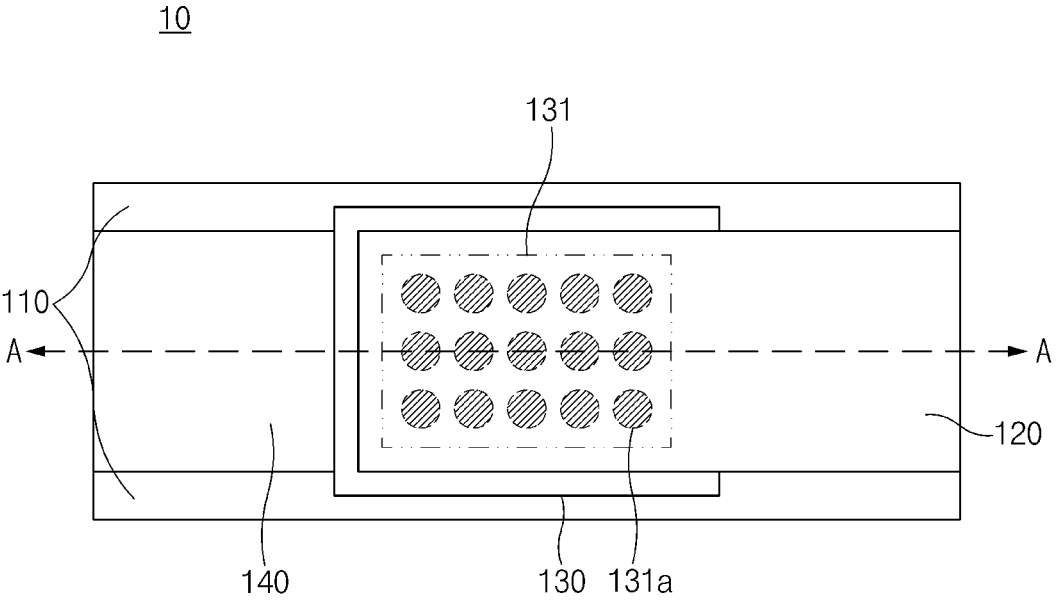
FIG. 1 is a top view of a memory device, according to an embodiment of the present disclosure.

Hereinafter, some embodiments of the present disclosure will be described in detail with reference to accompanying drawings. In the drawings, the same reference numerals will be used throughout to designate the same or equivalent elements. In addition, a detailed description of well-known features or functions will be omitted in order not to unnecessarily obscure the gist of the present disclosure.

FIG. 1 is a top view 10 of a memory device, according to an embodiment of the present disclosure.

A memory device to be described according to embodiments of the present disclosure may include a semiconductor substrate 110, a drain electrode 120, a floating gate region 130, and a source electrode 140.

The semiconductor substrate no may be a silicon substrate doped with impurities or a silicon on insulator substrate. According to an embodiment, the semiconductor substrate 110 may include an epitaxial layer.

The drain electrode 120 may be disposed on the semiconductor substrate 110.

The drain electrode 120 may include a conductor material, and for example, the conductor material may include metal or polysilicon. The drain electrode 120 may be connected to a signal line, and a plurality of signals having a preset voltage may be applied to the drain electrode 120 through the signal line.

The signals may include, for example, any one of a write signal, an erasing signal, and a read signal. The signals applied to the drain electrode 120 may correspond to mutually different voltages.

The write signal is a signal for storing data in the memory device, and a negative voltage may be applied to the drain electrode 120 to correspond to the write signal. In this case, the voltage may be referred to as a first voltage.

The erasing signal is a signal for erasing data stored in the memory device, and a positive voltage may be applied to the drain electrode 120 to correspond to the erasing signal. In this case, the voltage may be referred to as a second voltage.

The type and the quantity of charges moving from the drain electrode 120 to the floating gate region 130 may be varied depending on the type of the voltage applied to the drain electrode 120.

The read signal is a signal for reading data stored in the memory device. When the read signal is applied, a voltage may be applied with a value between values of the voltages applied to the drain electrode 120 corresponding to the write signal and the erasing signal, respectively.

The drain electrode 120 may be formed to be overlapped with the floating gate region 130. The floating gate region 130 may include a nano-dot region 131 including a plurality of nano-dot gates 131a.

The floating gate region 130 may receive electrons or holes from the drain electrode 120, and may store injected charges, depending on the voltage applied to the drain electrode 120. For example, when a first voltage is applied to the drain electrode 120 to correspond to the write signal, electrons are tunneled from the drain electrode 120 to the floating gate region 130.

In addition, when a second voltage corresponding to the erasing signal is applied to the drain electrode 120, holes are tunneled from the drain electrode 120 to the floating gate region 130.

When a voltage corresponding to the read signal is applied to the drain electrode 120, a current may flow from the drain electrode 120 to the source electrode 140 or may be prevented from flowing, depending on the type (electrons or holes) of charges stored in the floating gate region 130. The voltage corresponding to the read signal may be a value between values of the first voltage and the second voltage.

The electrons or holes may be tunneled to at least one nano-dot gate 131a included in the nano-dot region 131.

The nano-dot gate 131a may include at least one material selected from the group consisting of a conductor material, such as metal, and graphene. The nano-dot gates 131a may be uniformly distributed throughout the nano-dot region 131.

A region in which the nano-dot gates 131a are disposed may be referred to as the nano-dot region 131. According to an embodiment, a position for forming the nano-dot region 131 may be determined in a gate patterning process. The gate patterning process may refer to a process of etching remaining regions except for the position for forming the nano-dot region 131.

The drain electrode 120 may be overlapped with the nano-dot region 131. Accordingly, electrons or holes may be easily tunneled to the nano-dot gates 131a.

The floating gate region 130 may include an insulating layer region surrounding the nano-dot gates 131a, and adjacent nano-dot gates 131a may be electrically insulated from each other by the insulating layer region.

The source electrode 140 may make contact with the floating gate region 130. According to an embodiment, when the voltage corresponding to the read signal is applied to the drain electrode 120 depending on the type of charges stored in the nano-dot gate 131a, the current flow may be determined between the source electrode 140 and the drain electrode 120.

For example, when electrons are stored in the nano-dot gate 131a, a current flowing from the drain electrode 120 to the source electrode 140 may be interrupted by an electric field resulting from the electrons. When holes are stored in the nano-dot gate 131a, an inversion channel is formed such that a current may easily flow from the drain electrode 120 to the source electrode 140.

In other words, whether charges transfer between the source electrode 140 and the drain electrode 120 may be determined depending on the type of charges stored in the nano-dot gate 131a, such that data is read out of the memory device.

Figure 2:
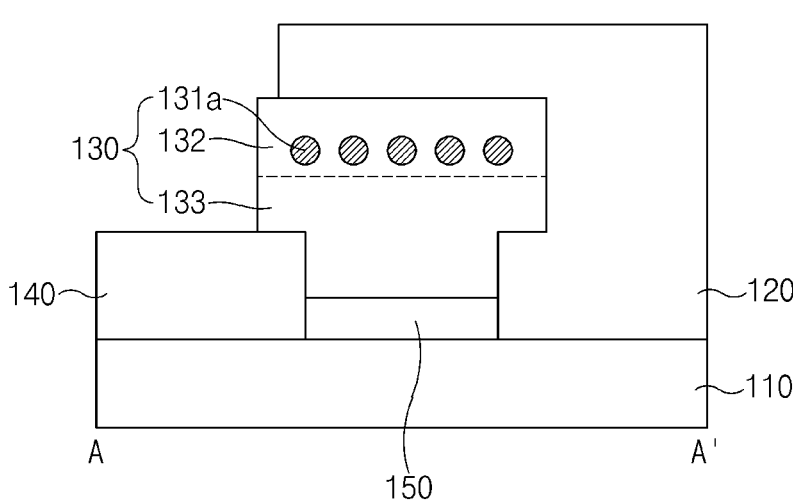
FIG. 2 illustrates a section of a memory device, which is taken along a first cutting line, according to an embodiment of the present disclosure.

FIG. 2 illustrates a section of a memory device, which is taken along a first cutting line (A-A') of FIG. 1, according to an embodiment of the present disclosure.

The duplicated description of FIG. 1 will be omitted for the convenience of the following description.

The relationship in the vertical structure between components included in the memory device is illustrated in FIG. 2.

The drain electrode 120 disposed on the semiconductor substrate 110 may include a first electrode extending in parallel to one surface of the semiconductor substrate no, a second electrode making contact with a lateral surface of the floating gate region 130 while extending perpendicularly to the one surface of the semiconductor substrate no, and a third electrode making contact with one surface of the floating gate region 130 while extending in parallel to the one surface of the semiconductor substrate no. The first electrode, the second electrode, and the third electrode may integrally constitute one electrode, may be merely provided for the purpose of explaining the structure of the drain electrode 120, and may not be mechanically separated from each other.

According to an embodiment, the drain electrode 120 may include a conductor material.

As the drain electrode 120 includes the first electrode, the second electrode, and the third electrode, the drain electrode 120 and the floating gate region 130 may make contact with each other on at least three surfaces.

The first electrode, the second electrode, and the third electrode included in the drain electrode 120 may be connected to each other. Electrons or holes may be tunneled to the floating gate region 130 depending on a voltage applied to the drain electrode 120, and data may be stored or erased depending on charges tunneled to the floating gate region 130.

In the memory device according to an embodiment of the present disclosure, the drain electrode 120 may inject charges into the floating gate region 130 without an additional gate electrode. In addition, the drain electrode 120 may inject charges into all nano-dot gates 131a, as the drain electrode 120 is overlapped with the entire portion of the nano-dot gates 131a included in the floating gate region 130.

As the gate electrode is not additionally formed, the degree of integration of the memory device may be improved, and the memory device may be implemented in smaller size.

The floating gate region 130 may include a plurality of nano-dot gates 131a, a first insulating layer region 132, and a second insulating layer region 133.

The first insulating layer region 132 and the second insulating layer region 133 may include an insulating material. The insulating material may include at least one selected from the group consisting of boron hexagonal nitride (h-BN), aluminum oxide ($Al_2O_3$), hafnium oxide ($HfO_2$), and silicon nitride.

When the thickness of the first insulating layer region 132 is thick, charge tunneling from the drain electrode 120 to the nano-dot gate 131a may not easily occur. According to an embodiment, the thickness of the first insulating layer region 132 may be 10 nm or less. In other words, the distance from the drain electrode 120 to the nano-dot gate 131a may be 10 nm or less.

When the thickness of the second insulating layer region 133 is thin, charges may easily transfer between the source electrode 140 and the nano-dot gate 131a, and charges charged in the nano-dot gate 131a may easily leak. Charging the nano-dot gate 131a with charges may refer to that electrons are collected in the nano-dot gate 131a through tunneling. According to an embodiment, the thickness of the second insulating layer region 133 may be in the range of 6 nm to 7.5 nm.

The first insulating layer region 132 and the second insulating layer region 133 may be formed through a deposition process.

The source electrode 140 may make contact with the floating gate region 130 and the channel region 150. The source electrode 140 may be disposed on the semiconductor substrate no. According to an embodiment, the source electrode 140 may include a conductor material.

The channel region 150 may be disposed on the semiconductor substrate no. In addition, the channel region 150 may be interposed between the drain electrode 120 and the source electrode 140 while making contact with the drain electrode 120 and the source electrode 140, when viewed in a direction parallel to one surface of the semiconductor substrate no.

The channel region 150 may be interposed between the floating gate region 130 and the semiconductor substrate no, when viewed in a direction perpendicular to the one surface of the semiconductor substrate no.

The nano-dot gates 131a may be overlapped with an upper portion of the channel region 150, and the overlap region between the nano-dot gates 131a and the channel region 150 may be overlapped with the drain electrode 120.

The channel region 150 may include a semiconductor material. According to an embodiment, the semiconductor material may include at least one selected from the group consisting of zinc oxide (ZnO), molybdenum disulfide ($MoS_2$), tungsten diselenide ($WSe_2$), tungsten disulfide ($WS_2$), molybdenum diselenide ($MoSe_2$), silicon (Si), germanium (Ge), semiconductor carbon nano-tubes (CNT), and black phosphorus (BP).

Charges may transfer between the drain electrode 120 and the source electrode 140 through the channel region iso. The charge transfer through the channel region 150 may be adjusted depending on a voltage applied to the drain electrode 120 and a charge charged in the floating gate region 130.

For example, when a voltage corresponding to the write signal is applied to the drain electrode 120, and when the charge flow in the channel region 150 is interrupted by the charges charged in the floating gate region 130, the channel region 150 may be determined as being turned off.

For example, when a voltage corresponding to the erasing signal is applied to the drain electrode 120, and when charge flow in the channel region 150 is not interrupted by the charges charged in the floating gate region 130, the channel region 150 may be determined as being turned on.

For example, when the floating gate region 130 is charged with electrons, a negative electric field resulting from the charged electrons may affect the channel region 150. Even if the voltage corresponding to the read signal is applied to the drain electrode 120, electron movement through the channel region 150 may be reduced, and the channel region 150 may be turned off, due to the negative electric field.

When the channel region 150 is turned off, the current does not smoothly flow, and thus data corresponding to 'o' may be expressed.

When the floating gate region 130 is filled with holes, a positive electric field resulting from the charged holes may generate a highly conductive inversion channel in the channel region iso. When the voltage corresponding to the read signal is applied to the drain electrode 120, electrons may move through the channel region iso, and the channel region 150 may be turned on, due to the inversion channel.

When the channel region 150 is turned on, the current smoothly flows, and thus data corresponding to '1' may be expressed.

The memory device may store data by utilizing a turn-on state and a turn-off state of the channel region 150. In addition, as electrons or holes injected into the nano-dot gate 131a do not leak when the read signal is applied to the drain electrode 120, the memory device may operate as the non-volatile memory.

Figure 3:
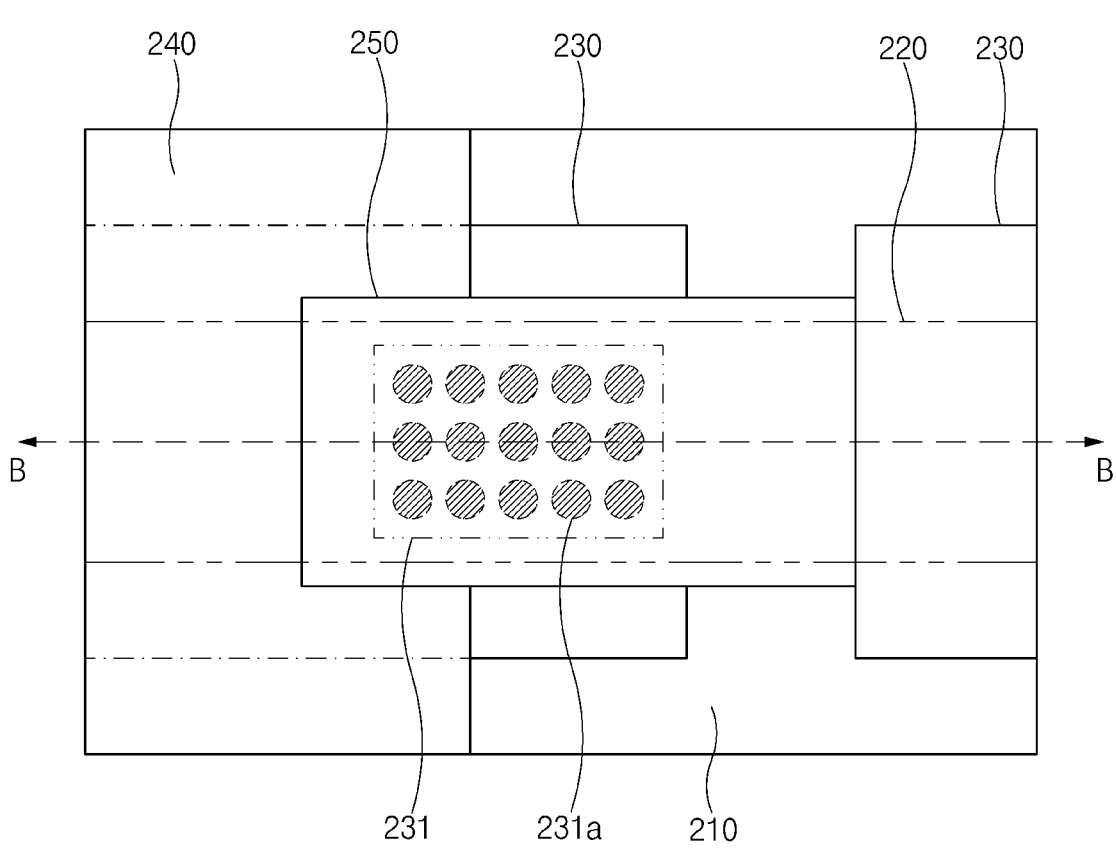
FIG. 3 is a top view of a memory device, according to another embodiment of the present disclosure.

According to embodiments of the present disclosure, the memory device continuously functions as a memory, as charges are distributedly stored in the plurality of nano-dot gates 131a, such that remaining charges in some nano-dot gates 131a form an electric field, even if charges flow out of other nano-dot gates 131a due to deterioration of the insulating layer regions 132 and 133. FIG. 3 is a top view of a memory device, according to another embodiment of the present disclosure.

The memory device illustrated in FIG. 3 may include components corresponding to components in the memory device described with reference to FIG. 1.

For example, a semiconductor substrate 210 of FIG. 3 may correspond to the semiconductor substrate no of FIG. 1, and a drain electrode 220 of FIG. 3 may correspond to the drain electrode 120 of FIG. 1.

Similarly, a floating gate region 230 of FIG. 3 may correspond to the floating gate region 130 of FIG. 1, and a source electrode 240 of FIG. 3 may correspond to the source electrode 140 of FIG. 1.

Hereinafter, a structure of a memory device according to another embodiment of the present disclosure will be described while focusing on the differences from FIG. 1.

According to another embodiment of the present disclosure, the memory device may differ from the memory device of FIG. 1 in position of a channel region 250. Further, in the memory device according to another embodiment of the present disclosure, the drain electrode 220 and the source electrode 240 may be arranged to cross each other.

That the drain electrode 220 and the source electrode 240 cross each other may refer to that the extending direction of the drain electrode 220 is perpendicular to the extending direction of the source electrode 240. Referring to FIG. 3, the drain electrode 220 may extend in a direction parallel to a second cutting line B-B' and the source electrode 240 may extend in a direction perpendicular to the second cutting line B-B'.

As the source electrode 240 and the drain electrode 220 are arranged to cross each other, the degree of integration of the memory device may be improved. In addition, the source electrode 240 and the drain electrode 220 may be positioned on mutually different planes.

In addition, in the memory device according to another embodiment of the present disclosure, the channel region 250 may be formed to be overlapped with the source electrode 240 and the drain electrode 220.

The channel region 250 may include both a region extending in parallel to one surface of the drain electrode 220, and a region extending perpendicular to the one surface of the drain electrode 220. The channel region 250 may be formed across a plurality of layers in the memory device.

According to another embodiment of the present disclosure, the memory device may include the floating gate region 230, and the floating gate region 230 may include a nano-dot region 231 including at least one nano-dot gate 231a.

The nano-dot region 231 may be overlapped with the drain electrode 220, and the channel region 250 may be overlapped with the nano-dot region 231.

Figure 4:
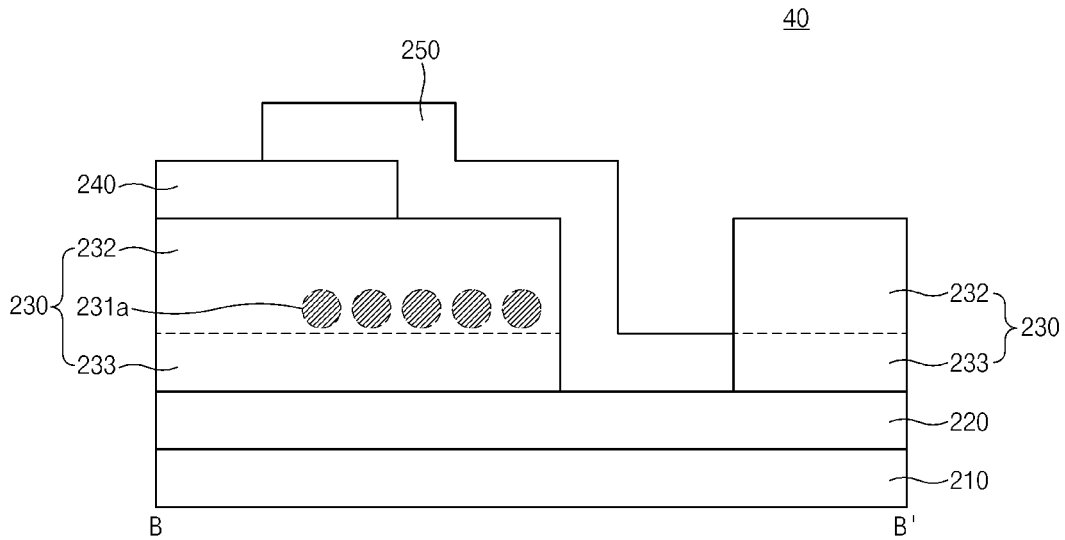
FIG. 4 illustrates a section of a memory device, which is taken along a second cutting line, according to another embodiment of the present disclosure.

FIG. 4 illustrates a section of a memory device, which is taken along the second cutting line B-B', according to another embodiment of the present disclosure.

A vertical structure of a memory device according to another embodiment of the present invention is illustrated in FIG. 4. The components of the memory device illustrated in FIG. 4 may correspond to the components described in FIG. 3.

As illustrated in FIG. 4, the drain electrode 220 may be disposed on the semiconductor substrate 210.

In addition, the floating gate region 230 may be formed on the drain electrode 220, and the floating gate region 230 may include the nano-dot gate 231a, a first insulating layer region 232, and a second insulating layer region 233. The second insulating layer region 233 may be formed such that a distance between the drain electrode 220 and the nano-dot gates 231a is 10 nm or less.

The channel region 250 may include a first region making contact with the drain electrode 220 while extending in parallel to one surface of the drain electrode 220, a second region making contact with a lateral side of the floating gate region 230 while extending perpendicularly to the one surface of the drain electrode 220, and a third region making contact with one surface of the floating gate region 130 while extending in parallel to the one surface of the drain electrode 220. The channel region 250 may make contact with the floating gate region 230 on at least two surfaces.

The third region included in the channel region 250 may be overlapped with the nano-dot gates 231a and may be disposed to be overlapped with the drain electrode 220.

The drain electrode 220 may be interposed between semiconductor substrate 210 and the channel region 250, and the source electrode 240 may be positioned on a plane different from that of the drain electrode 220.

The channel region 250 may be disposed to electrically connect the drain electrode 220 to the source electrode 240 while making contact with the floating gate region 230.

The signals applied to the drain electrode 220 and the operation method of the memory device may be substantially the same as those described with reference to FIGS. 1 to 2. FIGS. 5A to 5G illustrate a method for forming a memory device, according to an embodiment of the present disclosure.

Figure 5A:
FIGS. 5A to 5G illustrate a method for forming a memory device, according to an embodiment of the present disclosure.

Referring to FIG. 5A, a process of forming the channel region 150 on the semiconductor substrate no is illustrated. According to an embodiment, the semiconductor material may include at least one selected from the group consisting of zinc oxide (ZnO), molybdenum disulfide ($MoS_2$), tungsten diselenide ($WSe_2$), tungsten disulfide ($WS_2$), molybdenum diselenide ($MoSe_2$), silicon (Si), germanium (Ge), semiconductor carbon nano-tubes (CNT), and black phosphorus (BP).

The channel region 150 may be formed through a patterning process. The patterning process may include, for example, a thin film depositing process, and a process of coating and exposing a photosensitive material, or a process including etching, washing, and thin film depositing processes.

Figure 5B:
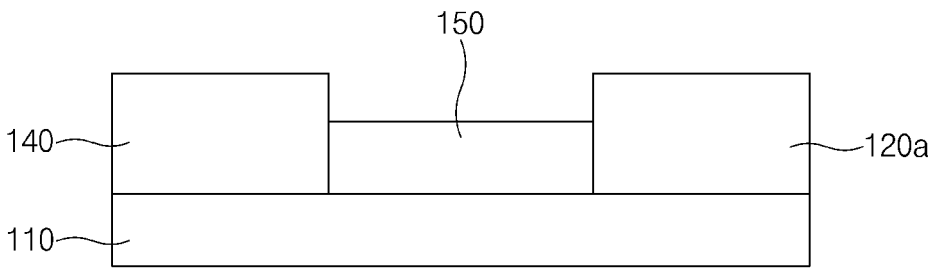

FIG. 5B illustrates a process of forming the first electrode 120a and the source electrode 140 included in the drain electrode 120.

Referring to FIG. 5B, the first electrode 120a and the source electrode 140 may be formed to be adjacent to the channel region iso. The electrodes 120a and 140 may be formed through a deposition process, and may include metal or polysilicon.

Figure 5C:
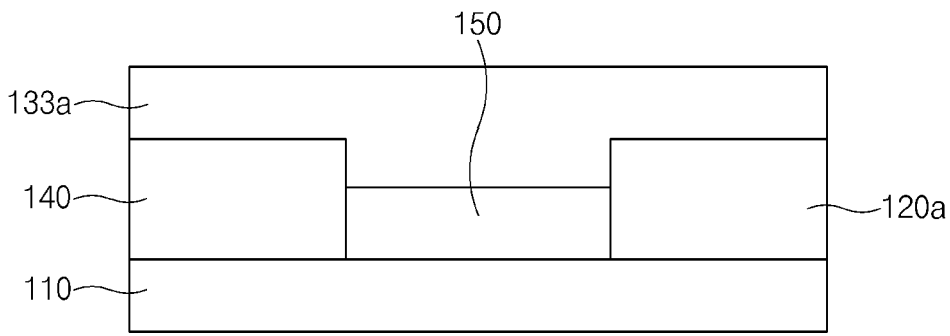

FIG. 5C illustrates a process of forming the second insulating material layer 133a on the source electrode 140, the first electrode 120a, and the channel region iso. The second insulating material layer 133a may become the second insulating layer region 133 through a patterning process thereafter.

The second insulating material layer 133a may include at least one selected from the group consisting of boron hexagonal nitride (h-BN), aluminum oxide ($Al_2O_3$), hafnium oxide ($HfO_2$), and silicon nitride.

Figure 5D:
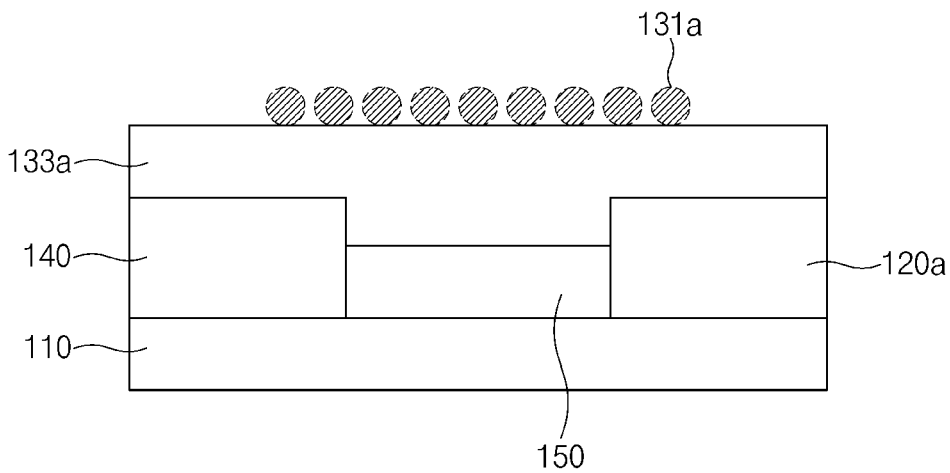

Referring to FIG. 5D, a process of forming nano-dot gates 131a on an upper portion of the second insulating material layer 133a is illustrated.

A region in which the nano-dot gates 131a are formed may be referred to as a nano-dot region. According to an embodiment, the nano-dot gates 131a may include a metal material. The nano-dot gates 131a may be formed by depositing a metal material on the second insulating material layer 133a and by patterning the nano-dot region through an etching process.

According to another embodiment of the present disclosure, the nano-dot gates 131a may include graphene. A graphene layer may be deposited on a region for forming the nano-dot gates 131a, a gold (Au) nano-layer may be deposited on the graphene layer, and an annealing process may be performed with respect to the resultant structure, thereby forming a gold nano-dot. Thereafter, the nano-dot gates 131a including graphene may be formed through plasma treatment. Thereafter, the gold nano-dot may be removed and only the nano-dot gates 131a positioned in the nano-dot region may remain through a patterning process.

Figure 5E:
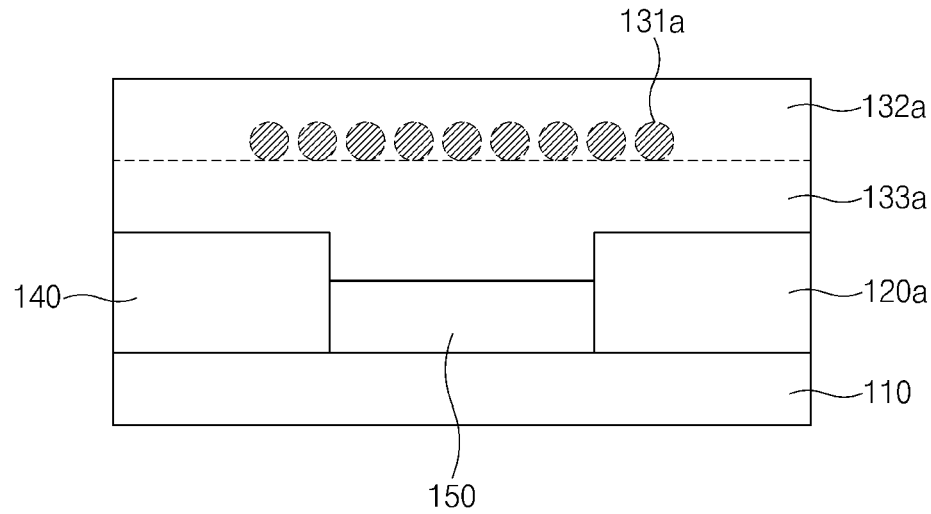

FIG. 5E illustrates a process of forming the first insulating material layer 132a on the nano-dot gates 131a.

The first insulating material layer 132a may become the first insulating layer region 132 through the patterning process thereafter. The vertical distance between the drain electrode 120 and the nano-dot gate 131a may be determined depending on the thickness of the first insulating material layer 132a. According to an embodiment of the present disclosure, the thickness of the first insulating material layer 132a may be 10 nm or less, such that the distance between the drain electrode 120 and the nano-dot gate becomes 10 nm or less.

Figure 5F:
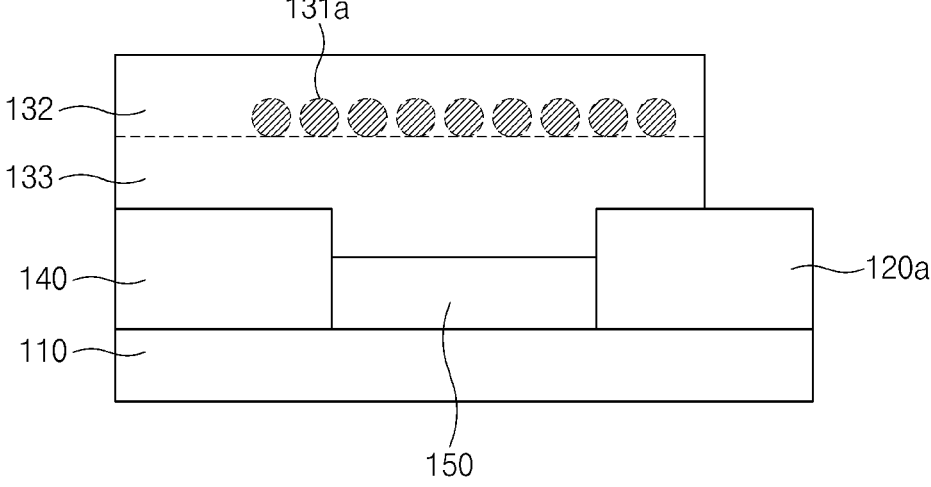

FIG. 5F illustrates a process of patterning the first insulating material layer 132a and the second insulating material layer 133a.

The first insulating material layer 132a and the second insulating material layer 133a are patterned, thereby ensuring a region for forming the second electrode included in the drain electrode 120.

In addition, the first insulating material layer 132a and the second insulating material layer 133a are patterned, thereby defining the floating gate region 130.

The second electrode makes contact with the lateral side of the floating gate region 130 while extending perpendicularly to one surface of the semiconductor substrate no.

Figure 5G:
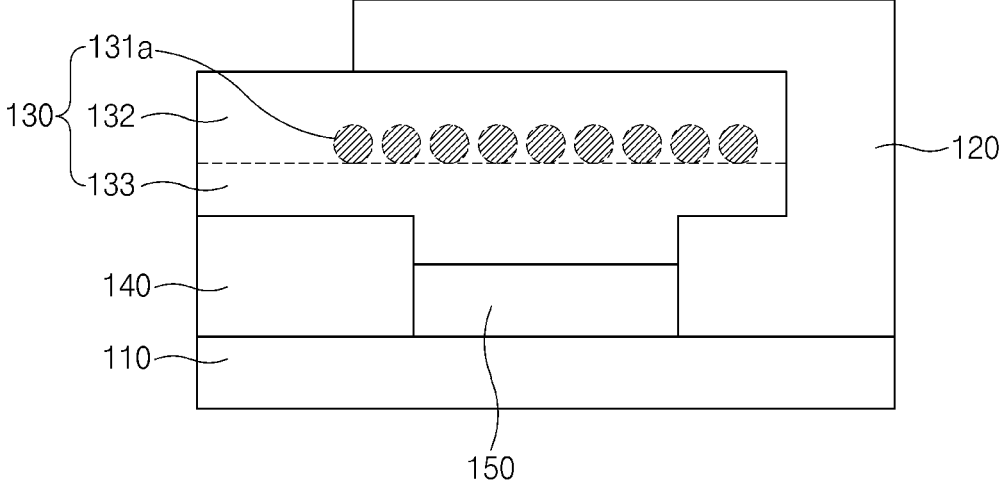

The second electrode may include a conductive material the same as that of the first electrode, and may be formed through a depositing processing. FIG. 5G illustrates a process of forming the drain electrode 120.

The drain electrode 120 may include a third electrode making contact with the top surface of the floating gate region 130 while extending in parallel to one surface of the semiconductor substrate 110.

The third electrode may be overlapped with the nano-dot region including the nano-dot gates 131a. In other words, the drain electrode 120 may have the form making contact with the channel region 150 while extending along a lateral side and a top surface of the floating gate region 130 from the channel region 150 to surround the floating gate region 130.

The third electrode may include a conductive material the same as those of the first electrode and the second electrode, and may be formed by depositing and patterning the conductive material.

According to an embodiment of the present disclosure, the degree of integration of the memory device may be improved, as the electrode is not separately formed.

In addition, according to various embodiments, as the floating gate includes a nano-dot gate, the endurance and the reliability of the memory device may be improved.

Besides, a variety of effects directly or indirectly understood through the specification may be provided.

Although the exemplary embodiments of the inventive concept have been described with reference to the accompanying drawings, it will be understood by those skilled in the art to which the inventive concept pertains that the inventive concept can be carried out in other detailed forms without changing the technical spirits and essential features thereof. Therefore, the above-described embodiments are exemplary in all aspects, and should be construed not to be restrictive.

Hereinabove, although the present disclosure has been described with reference to exemplary embodiments and the accompanying drawings, the present disclosure is not limited thereto, but may be variously modified and altered by those skilled in the art to which the present disclosure pertains without departing from the spirit and scope of the present disclosure claimed in the following claims.

What is claimed is:

1. A memory device comprising:
a drain electrode disposed on a semiconductor substrate;
a channel region in contact with the drain electrode;
a source electrode in contact with the channel region; and
a floating gate region in contact with the source electrode and the drain electrode, the floating gate region comprising a nano-dot region comprising at least one nano-dot gate,
wherein the drain electrode overlaps the nano-dot region,
wherein the nano-dot region overlaps the channel region, and
wherein the drain electrode comprises:
a first electrode in contact with an upper surface of the semiconductor substrate and extending in parallel to the upper surface of the semiconductor substrate,
a second electrode in contact with an upper surface of the first electrode and in contact with a lateral side of the floating gate region, and extending perpendicular to the upper surface of the semiconductor substrate, and
a third electrode in contact with an upper surface of the second electrode and in contact and overlapping with an upper surface of the floating gate region, and extending in parallel to the upper surface of the semiconductor substrate.

2. The memory device of claim 1, wherein an overlap region between the nano-dot region and the channel region is overlapped with the drain electrode.

3. The memory device of claim 1, wherein the third electrode overlaps the nano-dot region and the channel region.

4. The memory device of claim 1, wherein the channel region is interposed between the semiconductor substrate and the floating gate region.

5. The memory device of claim 1, wherein the channel region comprises:

a first region in contact with the drain electrode while extending in parallel to a first surface of the drain electrode;

a second region in contact with the lateral side of the floating gate region while extending perpendicularly to the first surface of the drain electrode; and a third region in contact with a first surface of the floating gate region while extending in parallel to the first surface of the drain electrode.

6. The memory device of claim 5, wherein the third region is overlapped with the nano-dot region and the drain electrode.

7. The memory device of claim 5, wherein the drain electrode is interposed between the semiconductor substrate and the channel region.

8. The memory device of claim 1, wherein the floating gate region includes an insulating layer region surrounding the at least one nano-dot gate.

9. The memory device of claim 8, wherein the at least one nano-dot gate is electrically isolated from another nano-dot gate adjacent to the insulating layer region.

10. The memory device of claim 8, wherein the insulating layer region comprises boron hexagonal nitride (h-BN), aluminum oxide ($Al_2O_3$), hafnium oxide ($HfO_2$), or silicon nitride.

11. The memory device of claim 1, wherein the channel region comprises a semiconductor material.

12. The memory device of claim 11, wherein the semiconductor material comprises zinc oxide (ZnO), molybdenum disulfide ($MoS_2$), tungsten diselenide ($WSe_2$), tungsten disulfide ($WS_2$), molybdenum diselenide ($MoSe_2$), silicon (Si), germanium (Ge), semiconductor carbon nano-tubes (CNT), or black phosphorus (BP).

13. The memory device of claim 11, wherein the semiconductor material comprises zinc oxide (ZnO), molybdenum disulfide ($MoS_2$), tungsten diselenide ($WSe_2$), tungsten disulfide ($WS_2$), or molybdenum diselenide ($MoSe_2$).

14. The memory device of claim 1, wherein the nano-dot gate comprises a metal material or graphene.

15. The memory device of claim 1, wherein a distance from the drain electrode to the nano-dot gate is 10 nm or less.

16. A method of forming the memory device according to claim 1, the method comprising:

forming the drain electrode on the semiconductor substrate;

forming the channel region in contact with the drain electrode;

forming the source electrode in contact with the channel region; and forming the floating gate region in contact with the source electrode and the drain electrode, the floating gate region comprising the nano-dot region.

17. The method of claim 16, wherein an overlap region between the nano-dot region and the channel region is overlapped with the drain electrode.

18. A memory device comprising:

a drain electrode disposed on a semiconductor substrate;

a channel region in contact with the drain electrode;

a source electrode in contact with the channel region; and a floating gate region in contact with the source electrode and the drain electrode, the floating gate region comprising a nano-dot region comprising at least one nano-dot gate, wherein the drain electrode overlaps the nano-dot region, wherein the nano-dot region overlaps the channel region, wherein the at least one nano-dot gate is configured to receive a charge tunneled from the drain electrode based on a voltage applied to the drain electrode, and wherein the drain electrode comprises:

a first electrode in contact with an upper surface of the semiconductor substrate and extending in parallel to the upper surface of the semiconductor substrate, a second electrode in contact with an upper surface of the first electrode and in contact with a lateral side of the floating gate region, and extending perpendicular to the upper surface of the semiconductor substrate, and a third electrode in contact with an upper surface of the second electrode and in contact and overlapping with an upper surface of the floating gate region, and extending in parallel to the upper surface of the semiconductor substrate.

19. The memory device of claim 18, wherein:

the at least one nano-dot gate is configured to receive an electron tunneled from the drain electrode due to a first voltage applied to the drain electrode; and the at least one nano-dot gate is configured to receive a hole tunneled from the drain electrode due to a second voltage applied to the drain electrode.

20. The memory device of claim 18, wherein the channel region is configured to be controlled to be turned on and turned off by the voltage applied to the drain electrode.

\* \* \* \* \*